United States Patent [19]
Moreen

[11] Patent Number: 5,326,642
[45] Date of Patent: Jul. 5, 1994

[54] INFRARED ABSORPTIVE COATING FOR BERYLLIUM SURFACE

[75] Inventor: Harry A. Moreen, Huntington Beach, Calif.

[73] Assignee: Rockwell International Corporation, Seal Beach, Calif.

[21] Appl. No.: 794,189

[22] Filed: Nov. 19, 1991

[51] Int. Cl.$^5$ .............................................. B32B 15/04
[52] U.S. Cl. .................................... 428/469; 428/336; 428/472.1; 428/472.2; 428/688; 428/689; 428/699; 428/702; 359/350
[58] Field of Search ............... 148/276, 284, 285, 277; 428/688, 689, 699, 702, 457, 469, 472.1, 336, 472.2; 376/220, 221, 208; 359/350, 360

[56] References Cited

U.S. PATENT DOCUMENTS

| | | | |
|---|---|---|---|
| 3,778,627 | 12/1973 | Carpenter | 376/193 |
| 4,127,443 | 11/1978 | Wetch | 376/220 |
| 4,398,294 | 8/1983 | Miller | 376/208 |
| 4,445,942 | 5/1984 | Cheng | 148/277 |
| 4,762,662 | 8/1988 | Harty | 376/220 |
| 4,824,730 | 4/1989 | Fukuda | 428/447 |
| 5,001,532 | 3/1991 | Petroff | 357/30 |
| 5,039,475 | 8/1991 | Kennel | 376/321 |
| 5,106,671 | 4/1992 | Amberger | 428/428 |
| 5,154,777 | 10/1992 | Blackmon | 136/245 |

*Primary Examiner*—Ellis P. Robinson
*Assistant Examiner*—Timothy M. Speer
*Attorney, Agent, or Firm*—H. Fredrick Hamann; George A. Montanye; Tom Streeter

[57] ABSTRACT

The INFRARED ABSORPTIVE COATING FOR BERYLLIUM SURFACE shown here is produced by providing a flat beryllium surface 10, which is cleaned 12, toughened 14, coated with a modifying material 16–22, and anodized 24. The modifying material, preferably aluminum, is selected for infrared absorptiveness. It is applied in a thickness, preferably about 0.0001 inch sufficient to provide such absorptiveness without excessively interfering with the nuclear hardness of the underlying beryllium.

2 Claims, 1 Drawing Sheet

INFRARED ABSORPTIVE COATING FOR BERYLLIUM SURFACE

This invention was made with Government support under Contract No. DASG60-86-C-0081 awarded by the Army. The Government has certain rights in this invention.

BACKGROUND OF THE INVENTION

The present invention relates to providing infrared absorptiveness, and has particular relation to providing such absorptiveness to a beryllium surface.

Infrared optics require the use of materials which are highly absorptive of infrared radiation. Unfortunately, infrared optics are often required in a nuclear hard environment, and the nuclear hard material of choice, beryllium, is reflective of Infrared radiation.

SUMMARY OF THE INVENTION

Nuclear hardness is a bulk property, and infrared absorptiveness is a surface property. The present invention therefore contemplates the use of an infrared absorptive modifying material, such as aluminum, as an anodized coating on a beryllium surface.

DETAILED DESCRIPTION OF A PREFERRED EMBODIMENT

Figure 1:
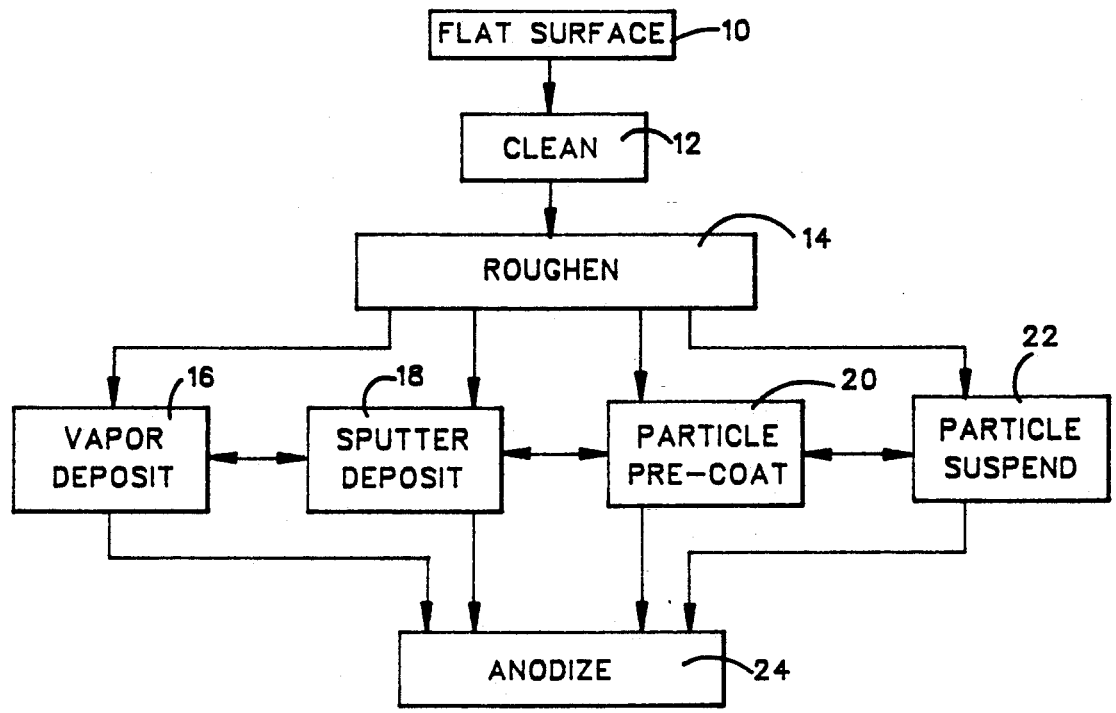
FIG. 1 shows a block diagram of the process used in the present invention.

In FIG. 1, a flat beryllium surface 10 is cleaned 12. The preferred method is to clean the surface by lapping it on 600 grit paper followed by etching tn hydrofluoric acid, but any suitable cleaning method may be used.

The clean surface is then toughened 14. This is preferably done by vapor deposition of a beryllium coating onto the cleaned beryllium surface. Sputter deposition is a possible alternative. Other toughening alternatives will occur to those having skill in the art.

Following the roughening step 14, the toughened surface is coated with a modifying material. The modifying material should have three characteristics. First, it should form a stable oxide, so that it will anodize well. Second, it should have a low atomic number, preferably 20 or smaller, so as to provide nuclear hardening. Third, the oxide should have a low reflectivity for infrared, particularly at the 10.6 micron wavelength of interest. Aluminum is the preferred modifying material. Magnesium and graphite might also produce acceptable results. Other materials will occur to those skilled in the art.

The material must now be coated onto the toughened surface. This may be done by vapor deposition 16 or by sputter deposition 18. Alternatively, particles of the modifying material may be precoated 20 onto the toughened surface, or particles may be suspended 22 in an anodizing solution. Any of these coating methods may be followed by almost any one or more of the others. Sputter deposition 18 is preferred. Particle suspension 22 may be used as a final method, and precoating 20 must not precede vapor deposition 16 or sputter deposition 20.

The coated material is then anodized 24. The preferred anodizing liquid is chromic acid mixed with potassium bichromate, which anodizes beryllium well, and which also interacts well with the above listed coating materials. Sulfuric acid is an alternative anodizing liquid. Other liquids will occur to those having skill in the art.

Figure 2:
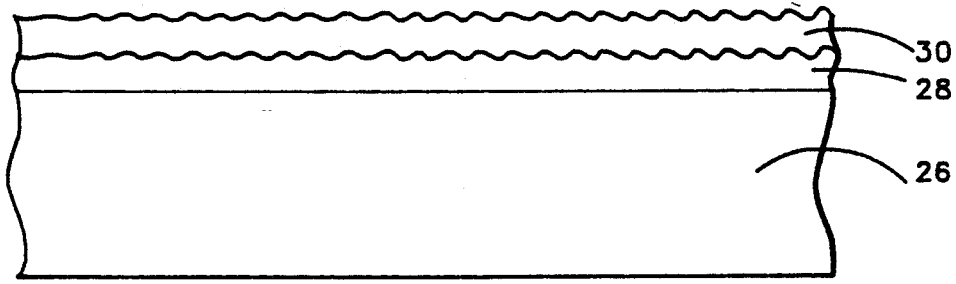
FIG. 2 is a cross section of the preferred form of the present invention.

FIG. 2 shows a piece of beryllium 26, the flat upper surface of which has a second layer of beryllium 28 sputtered upon it. The sputtering causes the upper surface of the layer 28 to be roughened. A third layer 30 of aluminum, or of some other suitable modifying material, is coated on the second layer 28. The toughening of the upper surface of the second layer 28 carries forward into a toughened upper surface of the third layer 30.

Figure 3:
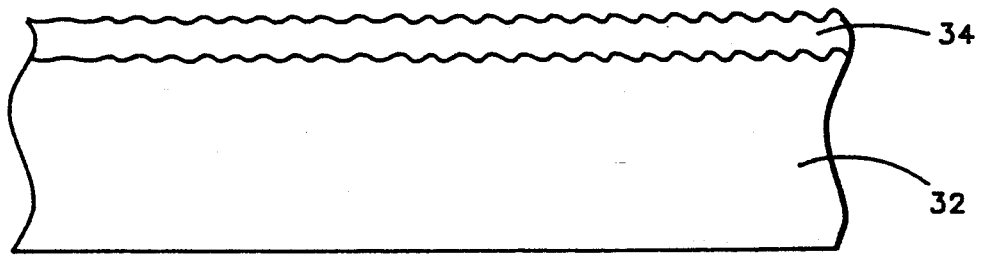
FIG. 3 is a cross section of an alternative form of the present invention.

In FIG. 3, a piece of beryllium 32 has a cleaned and toughened surface which has been produced directly, rather than by applying a second layer of beryllium to it. In this case, the modifying material may be applied in a thin layer 34 directly to the upper surface of the beryllium 32.

Nuclear hardness is a bulk property, and beryllium is ideal for this property. Infrared absorptiveness, however, is a surface property, for which beryllium is less than ideal. The infrared absorptive layer 30 (FIG. 2) or 34 (FIG. 3) should therefore be just thick enough to provide infrared absorptivity, without substantially degrading the nuclear hardness of the beryllium 26 or 32. Further, if the absorptive layer 30 or 34 is made too thick, the underlying roughness produced by the layer 28 or 32 will be smoothed out. The absorptive layer 30 or 34 should therefore be made less than 0.0005 inch thick, and preferably should be no thicker than 0.0001 inch.

INDUSTRIAL APPLICABILITY

The present invention is capable of exploitation In industry, and can be used, whenever nuclear hard, infrared absorptive optics are desired. It is capable of being made from components and materials which, taken separately and apart from one another, are entirely conventional, or it can be made from their non-conventional counterparts.

While several embodiments of the present invention have been described in some derail, the true scope and spirit of the present invention are not limited thereto, but are limited only by the following claims.

What is claimed is:

1. A nuclear hard, infrared absorptive composite comprising:
   (a) a piece of beryllium with a roughened surface; and
   (b) a layer, less than about 0.0005 inch thick, of anodized aluminum oxide on the roughened surface of the piece.

2. A nuclear hard, infrared absorptive composite comprising:
   (a) a piece of beryllium wit a roughened surface; and
   (b) a layer, less than about 0.0005 inch thick, of anodized magnesium oxide on the roughened surface of the piece.

* * * * *